United States Patent [19]
Lehmann et al.

[11] Patent Number: 5,759,903
[45] Date of Patent: Jun. 2, 1998

[54] CIRCUIT STRUCTURE HAVING AT LEAST ONE CAPACITOR AND A METHOD FOR THE MANUFACTURE THEREOF

[75] Inventors: Volker Lehmann, Munich; Michael Boy, Bamberg; Wolfgang Hoenlein, Unterhaching, all of Germany

[73] Assignee: Siemens Aktiengesellschaft, Munich, Germany

[21] Appl. No.: 556,639

[22] Filed: Nov. 13, 1995

Related U.S. Application Data

[63] Continuation of Ser. No. 196,906, Feb. 15, 1994, abandoned, which is a continuation of Ser. No. 912,508, Jul. 13, 1992, abandoned.

[30] Foreign Application Priority Data

Aug. 14, 1991 [DE] Germany .................. 41 26 917.9

[51] Int. Cl.⁶ ...................................... H01L 21/20
[52] U.S. Cl. ...................................... 438/386; 438/243
[58] Field of Search ........................ 437/41, 52, 60, 437/203, 919, 235; 361/311, 312, 313; 257/301; 438/243, 386

[56] References Cited

U.S. PATENT DOCUMENTS

| | | | |
|---|---|---|---|
| 3,661,741 | 5/1972 | Meek | 148/DIG. 51 |
| 3,916,041 | 10/1975 | Chu et al. | 427/253 |
| 3,968,565 | 7/1976 | Bertens et al. | 204/129.3 |
| 4,017,885 | 4/1977 | Kendall et al. | 437/919 |
| 4,650,544 | 3/1987 | Erb et al. | 437/919 |
| 4,658,283 | 4/1987 | Koyama | 257/301 |
| 4,688,064 | 8/1987 | Ogura et al. | 437/52 |
| 4,874,484 | 10/1989 | Foell et al. | 204/129.3 |
| 4,983,544 | 1/1991 | Lu et al. | 437/919 |
| 5,017,506 | 5/1991 | Shen et al. | 437/52 |

FOREIGN PATENT DOCUMENTS

| | | | |
|---|---|---|---|
| 0296348 | 12/1988 | European Pat. Off. . | |
| 2328090 | 12/1973 | Germany . | |
| 121080 | 9/1979 | Japan | 257/301 |
| 64-160063 | 4/1991 | Japan . | |
| 2197534 | 5/1988 | United Kingdom . | |

OTHER PUBLICATIONS

Morie et al, "Depletion Trench Capacitor Technology for Megabit Level MOS dRAM.", IEEE Electron. Device LeHors, vol. EDL-4, No. 11 Nov. 19 83 pp. 411–413.

*Primary Examiner*—Charles L. Bowers, Jr.
*Assistant Examiner*—Toniae M. Thomas
*Attorney, Agent, or Firm*—Hill & Simpson

[57] ABSTRACT

A circuit structure having at least one capacitor and a method for the manufacture thereof. The capacitor is constructed of a doped, single-crystal silicon substrate (1) that is provided with a plurality of hole openings (3) by electrochemical etching in a fluoride-containing, acidic electrolyte wherein the substrate is connected as an anode. The capacitor is further constructed of a dielectric layer (4) and of a conductive layer (5) as a cooperating electrode.

12 Claims, 2 Drawing Sheets

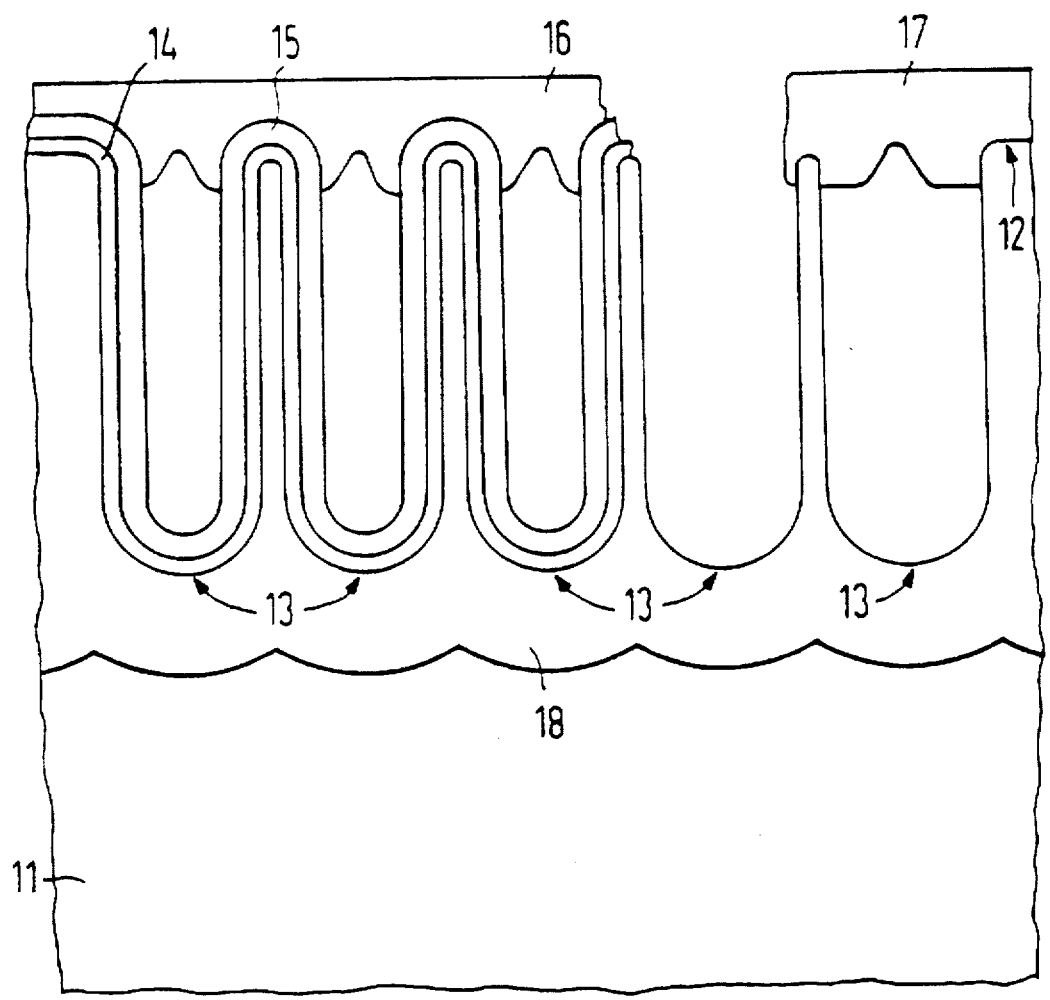

CIRCUIT STRUCTURE HAVING AT LEAST ONE CAPACITOR AND A METHOD FOR THE MANUFACTURE THEREOF

This is a continuation of application Ser. No. 08/196,906, filed Feb. 15, 1994, now abandoned which is a continuation of Ser. No. 07/912,508filed Jul. 13, 1992 now abandoned.

BACKGROUND OF THE INVENTION

Capacitors having a high specific capacitance are important in many technical fields, for example in microelectronics and in audio and video applications. The specific capacitance $C_S$ is defined as the capacitance C of a capacitor multiplied by the nominal voltage U divided by its volume V: $C_S = (C \cdot U)/V$.

Electrolyte capacitors of the type utilizing aluminum or tantalum are known as capacitors that have a high specific capacitance. These electrolyte capacitors are the only known capacitors that achieve a specific capacitance in the range of 10through 100 μFV/mm$^3$.

However, electrolyte capacitors have some disadvantages. For example, the electrolyte capacitors are destroyed when a voltage is incorrectly applied to the poles. Further, they are destroyed at temperatures above approximately 150° C., the maximum operating temperature being approximately 125° C. according to the data sheet. Due to the effective series resistance ESR of the arrangement, an electrolyte capacitor can be used only up to a limit frequency $f_G$ of approximately 100 kHz. The use of an electrolyte causes aging problems of the capacitor. Electrolyte capacitors cannot be integrated on a silicon chip. Moreover, electrolyte capacitors have a limited mechanical strength.

Trench capacitors are known for their use as semiconductor storage circuits. A trench capacitor has a conductive layer at the surface of a trench that is produced in a silicon substrate, with a dielectric layer arranged thereon and with a cooperating electrode. Since the trenches are produced in silicon by plasma etching, the ratio of trench depth to the aperture of the trench is limited to a value of approximately 10. The surface enlargement due to trench etching is therefore limited to values of approximately 15.

German reference DE 23 28 090 C2 discloses a method for manufacturing a semiconductor capacitor wherein the surface of a substrate of single-crystal silicon is provided with channels by means of an etching that is dependent on crystal orientation. The etching is performed with a 50% potassium hydroxide/water mixture at 85° C. Channels are formed having a depth of 500 μm and having a width of 5μm that are arranged at spacings of 10μm. In this manner the surface can be enlarged up to one hundred times. The maximally obtainable specific capacitance is limited to 2.3 μFV/mm$^3$ for a capacitor manufactured in this way.

SUMMARY OF THE INVENTION

The present invention is based on the problem of providing a circuit structure having at least one capacitor whose specific capacitance corresponds to that of electrolyte capacitors but which avoids the disadvantages of electrolyte capacitors. The present invention is also based on the problem of providing a method for manufacturing such a circuit structure.

This problem is inventively achieved with a circuit structure having at least one capacitor, wherein: a substrate of doped, single-crystal silicon having a first surface is provided; at least one part of the first surface is provided with hole openings by an electrochemical etching in a fluoride-containing, acidic electrolyte in which the substrate is connected as an anode, the hole openings having a depth that is greater than their diameter; a dielectric layer is arranged on the first surface, the dielectric layer conformally covering the first surface at least in the region of the hole openings and the layer thickness thereof being less than half a diameter of the hole openings; a conductive layer is arranged on the dielectric layer; and the surface and the conductive layer are each respectively provided with a contact.

In a method of the present invention for manufacturing the circuit structure having at least one capacitor, a plurality of hole openings are etched into a substrate of single-crystal, n-doped silicon with an electrochemical etching in a fluoride-containing, acidic electrolyte, the substrate being connected as an anode of an electrolysis cell. The surface of the hole openings is provided with a dielectric layer that is conformally deposited at less of a thickness than half a diameter of the hole openings. Finally a conductive layer is formed on the dielectric layer with vapor-phase deposition.

The surface of the substrate is structured in a characteristic way by means of the electrochemical etching. Substantially regularly arranged hole structures form at the surface of the substrate. Aspect ratios up into the range of 1:1000 are achieved with these hole structures.

In the circuit structure of the present invention, the effective area of the capacitor is increased by a multiple in comparison to the space requirement of the capacitor on the substrate due to the multitude of hole openings in the first surface. Specific capacitances comparable to electrolyte capacitors can therefore be achieved in the circuit structure of the present invention. Specific capacitances up to a maximum of 100 μFV/mm$^3$, but typically in the region of approximately 10μFV/mm$^3$, are achieved with the capacitor of the present invention.

Although the capacitor manufactured by electrochemical etching in fact exhibits a lower capacitance in the circuit structure of the present invention when the poles are reversed, it nonetheless has the same or a somewhat higher breakdown voltage and is therefore not destroyed when the poles are reversed. In circuit applications where the same capacitances should occur when the poles are reversed, it is within the frame work of the present invention to provide two structurally identical capacitors in the circuit structure that are connected in parallel and oppositely polarized. In order to achieve identical capacitance given a reversal of the poles, it also is within the frame work of the present invention to more highly dope the substrate after the electrochemical etching.

The capacitor in the circuit structure of the present invention is insensitive to temperature up to approximately 600° C. given the employment of tungsten contacts. The relative change in capacitance with temperature is below 1% per 100° C. Since the capacitor is a solid state capacitor, parasitic resistances are minimized in the circuit structure of the present invention. Solid conductors have lower resistances in comparison to electrolytes. The capacitor can be employed up to a limit frequency $f_G$ in the range of 1 MHz.

It is with the frame work of the present invention to employ silicon dioxide, silicon nitride or titanium dioxide or combinations of these layers as a dielectric layer. Silicon dioxide is one of the best known dielectrics and can therefore be governed extremely well. Higher capacitances are achieved with a dielectric of titanium dioxide because of the higher dielectric constant. Especially low defect densities are achieved by using a multi-layer dielectric having a layer sequence of $SiO_2$, $Si_3N_4$, $SiO_2$.

The capacitor in the circuit structure of the present invention contains neither heavy metals nor electrolytes. It is therefore environmentally friendly.

The circuit structure of the present invention is preferably manufactured by means of an electrochemical etching. Hole openings can thereby be achieved wherein the ratio of depth to diameter is considerably higher than 10, particularly between 25 and 1000. Surface enlargements of 35 through 1400 are thus achieved.

European Patent Application EP 0 296 348 A1 in fact discloses a method for producing hole openings or trenches in n-doped silicon by means of an electrochemical etching. However, it is disclosed for manufacturing trench capacitors, to use deep vertical dopings given low horizontal dopant depth as required, for example, in high-capacitance controllable capacitors (varicaps), for producing deep, narrow trenches for electrical insulation between neighboring regions in a silicon substrate, for contacting more deeply disposed layers or for producing voltage-controlled transistors. Since this method is optimized for microelectronic applications wherein hole densities of the dielectric are in the region of $1/cm^2$, it cannot be transferred without further steps to the manufacture of capacitors having high specific capacitances since defect densities of this order of magnitude cannot be accepted therein.

The manufacturing method of the present invention proceeds on the basis of a substrate of n-doped silicon and commercially available substrates are used. This results in an economic manufacture of the capacitor. A plurality of capacitors can be simultaneously manufactured on the substrate, these being separated from one another in a last method step. Also, the capacitor is mechanically stable. It is possible to integrate the capacitor with other circuit elements in a circuit structure. Proceeding on the basis of a commercially available silicon wafer, a structural height of 0.5 mm is achieved, so that the capacitor can be ideally used for SMD (surface-mounted device) applications.

The entire know-how of silicon microelectronics contributes to the optimization of the manufacturing method.

A dielectric layer is produced at the surface of the substrate after the hole openings are manufactured. Since this dielectric layer should conformally cover the entire surface, including the region of the hole openings, dielectric layers that can be produced thermally or by vapor-phase deposition are suitable. It has been shown that dielectric layers produced in this manner have extremely low defect densities, which is critical for the functioning of the capacitor, particularly given high aspect ratios. For example, the dielectric layer is formed of $SiO_2$ by thermal oxidation. This method involves only a small outlay.

The defect density can be reduced even farther down to values of better than $1/400$ $cm^2$ by using a multi-layer dielectric, for example a layer sequence of silicon oxide-silicon nitride-silicon oxide (what is referred to as ONO), these values being necessary in order to achieve realistic production yields.

It is within the frame work of the present invention to form the dielectric layer of $SiO_2$ by anodic oxidation, particularly in an electrolyte containing acidic acid. Compared to thermal silicon dioxide, anodic silicon dioxide has the advantage that it is produced at room temperature. As a result, mechanical stresses are avoided. Over and above this, the formation of oxide in anodic oxidation is a self-curing process since an intensified oxidation appears at a thin location in the oxide due to elevation of the field strength. The thin location is therefore reinforced and the hole is cured.

Given manufacture of the dielectric layer on the basis of vapor-phase deposition of titanium dioxide, a higher capacitance is achieved in the finished capacitor for the same layer thickness of the dielectric layer.

In the electrochemical etching, that surface of the substrate in which hole openings are to be produced by the etching is brought into contact with an electrolyte. A fluoride-containing, acidic electrolyte is employed. Over and above this, the electrolyte can contain a wetting agent or other acids. The erosion of material by electrochemical etching is increased when that surface of the substrate facing away from the electrolyte is illuminated.

In electrochemical etching, the substrate is connected as the anode. Minority charge carriers in the n-doped silicon therefore move to the surface in contact with the electrolyte. A space charge zone is formed at the surface. Since the field strength in the region of depressions in the surface is higher than there beyond, the minority charge carriers tend to move to these points and a structuring of the surface results. More and more minority carriers move to an irregularity the deeper an initially small irregularity becomes due to the etching and the etching attack at this location is therefore all the more pronounced.

It is advantageous in order to achieve a uniform distribution of the hole openings in the substrate to provide the surface with a surface topology before the electrochemical etching. This surface topology contains irregularities that act as nucleation for the etching attack in the following electrochemical etching. It is within the frame work of the present invention to produce such a surface topology with the assistance of conventional photolithology. After producing a photoresist mask, the surface of the substrate is thereby provided with the surface topology by anisotropic etching. The electrochemical etching occurs after the photoresist mask is stripped off.

A further possibility for forming a surface topology is in illuminating the surface of the substrate with an illumination pattern corresponding to the surface topology. The potential at the substrate is thereby set such that electrochemical etching does not yet occur without illumination. The intensity of the illumination is selected such that a current flows upon illumination of the surface of the substrate due to the formation of electron-hole pairs, this current while being adequate for the electrochemical etching does not exceed the maximum value for electrochemical etching. In this way, the substrate is etched only at the illuminated locations. Irregularities thus occur that act as nuclei in the following, electrochemical etching. A photoresist mask need not be produced given this light-induced electrochemical etching. An illumination through a mask positioned between the substrate and light source is adequate. It is also possible to implement the illumination by means of a diffraction pattern or a hologram.

For manufacturing a plurality of capacitors, a wafer-shaped substrate is provided with hole openings over its entire surface. After a surface-wide application of the dielectric layer, of the conductive layer and of the contact, individual capacitors are defined by means of conventional photolithology. The individual capacitors are structured by etching down to the dielectric layer. Subsequently, the capacitors are separated from one another by sawing and breaking, as known in chip manufacture.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 3 is a section view through a capacitor of the present invention that is contacted proceeding from the surface.

DESCRIPTION OF THE PREFERRED EMBODIMENT

Figure 1:
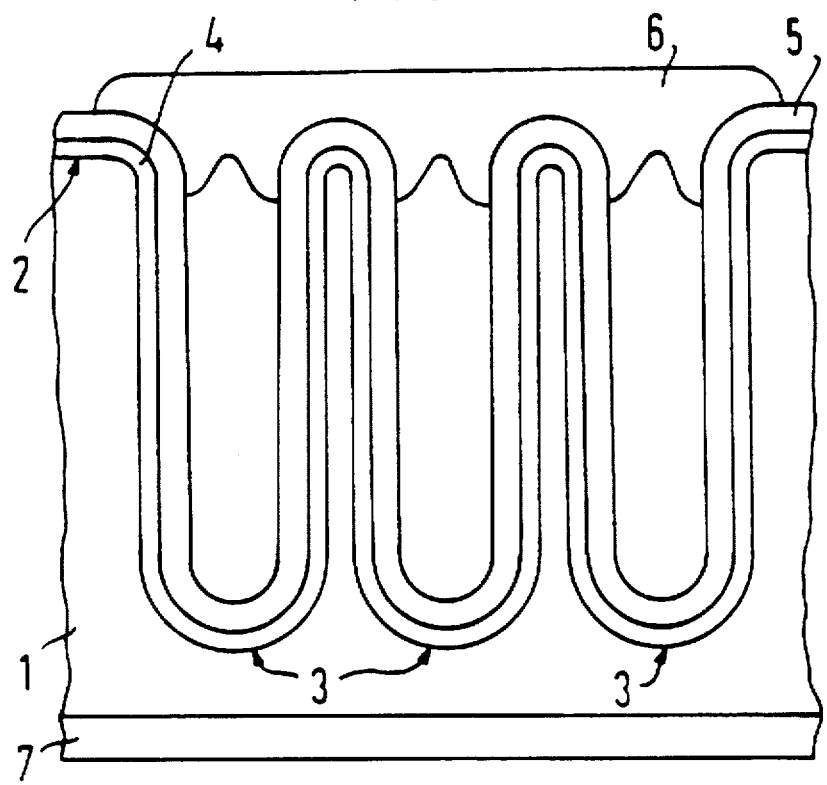
FIG. 1 is a section view through a capacitor of the present invention.

A substrate 1 of n-doped, single-crystal silicon that has a resistivity of 5 ohms × cm has a first surface 2 provided with a plurality of hole openings 3. The hole openings 3 have a diameter of, for example, 2 µm and a depth of, for example, 200 µm (see FIG. 1; in the illustration, a different scale is used in the direction of the hole depth than in the direction of the hole diameter). The first surface is conformally covered with a dielectric layer 4. The dielectric layer 4 is composed, for example, of $SiO_2$ and has a thickness of, for example, 60 nm. A conductive layer 5 is arranged on the dielectric layer 4. The conductive layer 5 is composed, for example, of n-doped polysilicon. The conductor layer 5 completely covers the dielectric layer 4.

The conductive layer 5 is contacted by a first contact 6. The first contact 6 is composed, for example, of aluminum. Due to the surface tension of the aluminum, the first contact 6 is composed of a continuous layer that only contacts the upper part of the conductive layer 5 in the region of the hole openings 3. The gaps between neighboring surfaces of the conductive layer 5 that are present because of the structure in the region of the hole openings 3 are not filled up by the first contact 6. This is likewise not necessary for the functioning of the capacitor since the conductive layer 5 acts as an electrode. A second contact 7 of, for example, aluminum is applied on the surface of the substrate facing away from the first surface 2. If the capacitor is to be resistant to high-temperature, tungsten is used for the first contact 6 and the second contact 7.

When the first contact 6 is connected during operation to a positive pole and the second contact 7 is connected to a negative pole, the capacitor has a maximum capacitance. The capacitance is minimum given an opposite connection of the poles. Independently of the pole connection, the capacitance always has the maximum value by doping the substrate with, for example, As or P with a dopant concentration in the range of $10^{19}$ through $10^{21}$ cm$^{-3}$ after the electrochemical etching.

Figure 2:
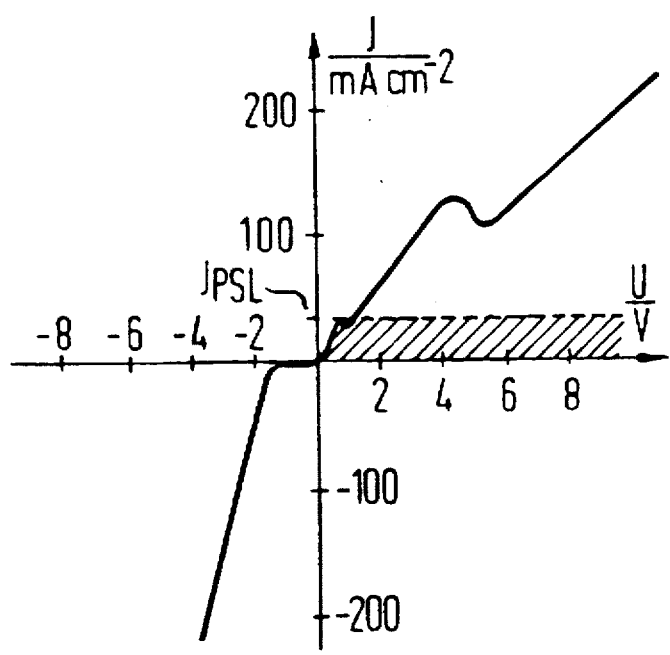
FIG. 2 is a graph depicting the characteristic of an electrolyte-n-doped silicon contact.

FIG. 2 depicts the characteristic of a contact between a fluoride-containing, acidic electrolyte and n-doped silicon.

Electrochemical etching occurs in the shaded region of the characteristic. An electro-polishing surface layer is formed above the shaded region. Structures can no longer form at the surface given electro-polishing. It is therefore important for the electrochemical etching to set the current density such that the contact is in the shaded region of the characteristic. This occurs by the setting of the current density.

The silicon substrate is provided with a surface topology for manufacturing the capacitor shown in FIG. 1. For example, the surface topology can be provided conventionally by means of photolithography or by illuminating the substrate surface while it is in contact with the electrolyte and by holding the current density in the lower range of the shaded region of the characteristic in FIG. 2.

The formation of the hole openings 3 occurs next by means of an electrochemical etching. A 6% hydrofluoric acid (HF), for example, is used as an electrolyte. The n-doped substrate is charged with a potential of 3 volts as the anode. The substrate is illuminated from the back side and a current density of 10 mA/cm$^2$ is set. After approximately 150 minutes of etching time, the hole openings have a diameter of 2 µm given a depth of 200 µm.

The substrate is subsequently rinsed in an alkaline solution that, for example, contains 50% ethylenediamine, for 5 minutes at a positive potential of, for example, 10 volts. Porous silicon is thereby removed, this being formed at the surface of the substrate in the electrochemical etching.

After thorough rinsing with water, the dielectric layer 4 is formed on the substrate 1 by anodic oxidation.

To that end, the substrate 1 is oxidized in an electrolyte that, for example, contains 2% acidic acid, at a current density of, for example, 10 µA/cm$^2$. The thickness of the dielectric layer 4 of $SiO_2$ that is thereby formed is controlled by the duration of the oxidation. A thickness of 60 nm results, for example, in 16 hours.

A further possibility for manufacturing the dielectric layer 4 is a thermal oxidation of the surface of the hole openings 3. However, on higher mechanical stresses in the substrate 1 must be expected, since thermal $SiO_2$ cannot be produced at room temperature. The conductive layer 5 is deposited on the dielectric layer 4 from n-doped polysilicon in a standard CVD (chemical vapor deposition) process.

For improved contacting, the first contact 6 and the second contact 7 are formed by vapor-deposition with, for example, aluminum.

Individual capacitors are defined at the wafer surface by means of conventional photolithography. The first contact 6 of aluminum and the conductive layer 5 of polysilicon are thereby etched down to the dielectric layer 4. The capacitors are subsequently separated from one another by sawing and breaking.

As depicted in FIG. 3, substrate 11 of n-doped, single-crystal silicon that has a resistivity of 5 ohms × cm has a first surface 12 provided with a plurality of hole openings 13. The hole openings 13 have a diameter of, for example, 1 µand a depth of, for example, 400 µm (note: FIG. 3 is not true-to-scale). The hole openings 13 have been produced in the substrate 1 by electrochemical etching in a fluoride-containing, acidic electrolyte in which the substrate 11 is interconnected as the anode, analogous to that set forth with reference to FIG. 1 and FIG. 2.

The first surface 12 is conformally covered with a dielectric layer 14. For example, the dielectric layer 14 is produced by combined application of $SiO_2$, $Si_3N_4$ and $SiO_2$ again and has a thickness of 60 nm. The conductive layer 15 is arranged on the dielectric layer 14. For example, the conductive layer 15 is composed of n-doped polysilicon.

The dielectric layer 14 and the conductive layer 15 are laterally limited. The dielectric layer 14 thereby projects beyond the conductive layer 15. The conductive layer 15 is contacted by a first contact 16, the first contact 16 being composed, for example, of aluminum. Due to the surface tension of the aluminum, the first contact 16 is composed of a continuous layer that contacts only the upper part of the conductive layer 15 in the region of the hole openings 13. The first contact 16 is structured such that it is located only at the laterally limited, conductive layer 15.

A region 18 of increased doping is located in the substrate 11 at the first surface 12. After the electrochemical etching, the doping in the region 18 with Arsenic (As) or phosphorus (P) is set to a dopant concentration in the range from $10^{19}$ through $10^{21}$ cm$^{-3}$. The region 18 of increased doping causes the capacitance of the capacitor to always have the maximum value independently of the connection of the poles.

A second contact 17 is located on the uncovered, first surface 12 laterally of the dielectric layer 14 and of the conductive layer 15. The second contact 17 directly contacts the region 18 of an increased doping. Due to the arrangement of the second contact 17 at the first surface 12, the effective series resistance ESR of the arrangement is reduced, so that the capacitor can be employed up to limit frequencies in the range of 1 MHz. Due to the arrangement of both the first contact 16 as well as of the second contact 17 at the first surface 12, the capacitor depicted in FIG. 3 is also suitable for integration in a silicon chip.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A method for manufacturing a circuit structure having at least one capacitor, comprising the steps of:

providing a substrate of single-crystal, n-doped silicon;

etching a plurality of hole openings into the substrate in a region thereof with an electrochemical etching in a fluoride-containing, acidic electrolyte such that the region with the plurality of hole openings has a surface area that is greater, by a surface enlargement value, than a surface area of the region without the plurality of hole openings, the substrate being connected as an anode of an electrolysis cell, the hole openings having diameters in the range of 0.1 μm through 10 μm and depths in the range of 10 μm through 500 μm, a ratio of depth to diameter of the hole openings being greater than 25;

providing a surface of the hole openings with a dielectric layer, said dielectric layer being generated as a triple layer of $SiO_2$, $Si_3N_1$, and $SiO_2$, having a thickness that is less than half a diameter of the hole openings; and forming a conductive layer on the dielectric layer by vapor-phase deposition such that the at least one capacitor is formed and has a capacitance in the range of 10 μFV/mm$^3$–100 μFV/mm$^3$.

2. The method according to claim 1, wherein a surface of the substrate opposite the electrolyte is illuminated.

3. The method according to claim 1, wherein a surface of the substrate opposite the electrolyte is provided with a surface topology before the electrochemical etching.

4. The method according to claim 3, wherein the surface topology is produced by means of photolithography.

5. The method according to claim 3, wherein the surface topology is produced by light-induced electrochemical etching with an illumination pattern corresponding to the surface topology.

6. The method according to claim 1, wherein the substrate is rinsed in an alkaline solution after the electrochemical etching, whereby the substrate is connected as the anode.

7. The method according to claim 1, wherein the conductive layer is formed by vapor-phase deposition of doped polysilicon.

8. The method according to claim 1, wherein the substrate is doped with one of dopant As and dopant P to at least $10^{19}$ cm$^{-3}$ after the electrochemical etching.

9. The method according to claim 1, wherein the conductive layer is structured by etching down to the dielectric layer.

10. The method according to claim 9, wherein the dielectric layer is structured by etching down to the substrate, and wherein a contact to the substrate is formed on a surface that is uncovered by the etching down.

11. The method according to claim 1, wherein the respective contacts on the surface of the conductive layer and on a surface of the substrate are produced by vapor-deposition with metal.

12. The method according to claim 1, wherein the surface enlargement value is in the range of 35 to 1400.

* * * * *